United States Patent [19]
Ueda

[11] Patent Number: 5,158,904
[45] Date of Patent: Oct. 27, 1992

[54] PROCESS FOR THE PREPARATION OF SEMICONDUCTOR DEVICES

[75] Inventor: Takashi Ueda, Nara, Japan

[73] Assignee: Sharp Kabushiki Kaisha, Osaka, Japan

[21] Appl. No.: 742,342

[22] Filed: Aug. 8, 1991

[30] Foreign Application Priority Data

Aug. 27, 1990 [JP] Japan .................. 2-227069

[51] Int. Cl.⁵ .......................................... H01L 21/265
[52] U.S. Cl. .................................... 437/45; 437/40; 437/29; 437/931; 437/41; 148/DIG. 82
[58] Field of Search .................. 437/40, 41, 42, 43, 437/44, 45, 46, 931, 29; 148/DIG. 82

[56] References Cited

U.S. PATENT DOCUMENTS

| | | | |
|---|---|---|---|
| 3,895,966 | 7/1975 | MacDougall et al. | 437/41 |
| 3,959,025 | 5/1976 | Polinsky | 437/45 |
| 4,235,011 | 11/1980 | Butler et al. | 437/40 |
| 4,258,077 | 3/1981 | Mori et al. | 437/41 |
| 4,356,042 | 10/1982 | Gedaly et al. | 437/45 |
| 4,737,471 | 4/1988 | Shirato et al. | 437/29 |
| 4,845,047 | 7/1989 | Holloway et al. | 437/45 |

Primary Examiner—Brian E. Hearn
Assistant Examiner—Kevin M. Picardat
Attorney, Agent, or Firm—Nixon & Vanderhye

[57] ABSTRACT

A process for preparing a semiconductor device, which includes; forming on a semiconductive silicon substrate a gate oxide film and a gate electrode constituting a MOS transistor, a semiconductor element protective film on the gate electrode and a wiring layer on the protective film; forming, above the gate electrode, a first photoresist film having an opening correspondingly in position to a point that a channel region is to be provided, a silicon oxide film provided by spin-on-glass method and a second photoresist film having the same pattern as the first photoresist film in this order; etching by use of the second photoresist film as a mask to form a mask pattern which comprises three layers of the first and second photoresist films and the intervening silicon oxide film sandwiched therebetween and has an opening above the gate electrode correspondingly in position to that point for provision of the channel region; applying an impurity ion with high energy from above and through which mask pattern to be implanted under the gate electrode to form the channel region.

9 Claims, 4 Drawing Sheets

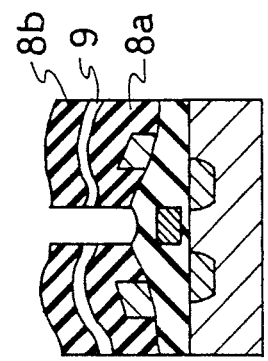 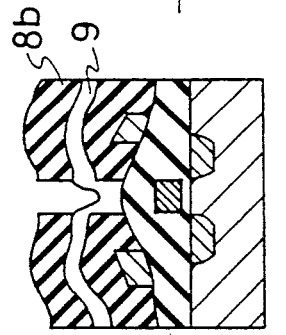 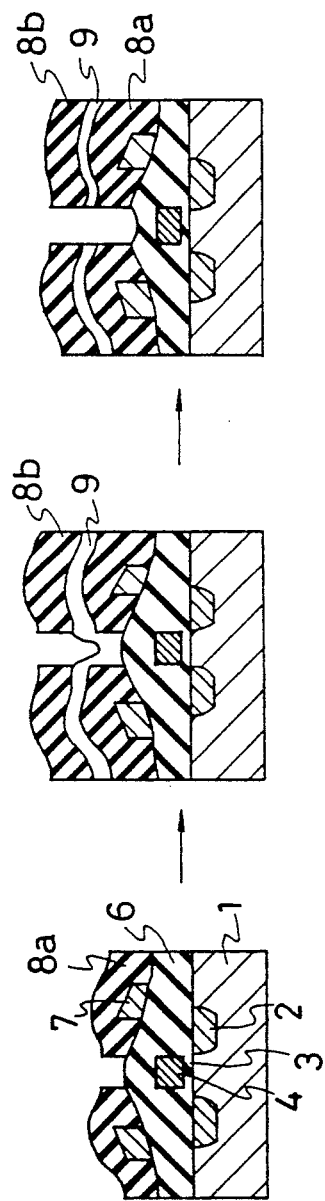
FIG.1(a)   FIG.1(b)   FIG.1(c)
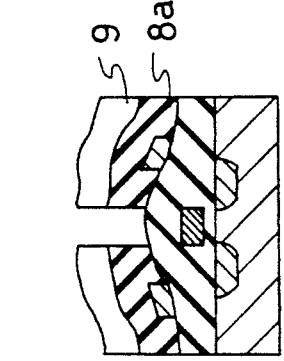 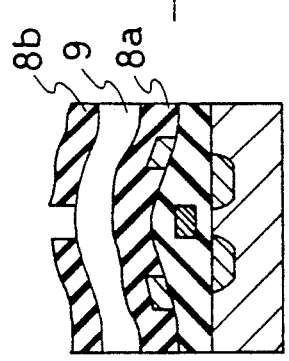 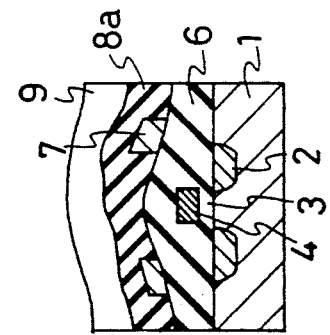
FIG.2(a)   FIG.2(b)   FIG.2(c)

PROCESS FOR THE PREPARATION OF SEMICONDUCTOR DEVICES

BACKGROUND OF THE INVENTION

1. Field of the Invention

The invention relates to a process for preparing a semiconductor device, and more particularly to a process for preparing a mask for use in ion implantation.

2. Description of the Related Art

A conventional method for the preparation of a semiconductor device involves such manner that on the surface of an intermediate product of a semiconductor device, which comprises a semiconductive silicon substrate 11, an active layer (Source and Drain) 12, a gate oxide film 13, a gate electrode 14, an isolating oxide film 15, a passivation film (a protective layer) 16 and metal wiring 17 each formed on the substrate in this order as shown in FIG. 5, is formed a photoresist film 18 of 1 to 2 μm in thickness which photoresist film then applied at its portion above the gate electrode 14 with light by lithography and developed to have an opening. An impurity ion with 400 keV high energy is applied to the photoresist film 18 from above to implant the impurity ion under the gate oxide film 13 through the opening of the photoresist film 18 used as a mask, so that a channel region is provided under the gate oxide film of the semiconductor device. A combination of a silicon thermal oxide film or a silicon nitride film with a photoresist film is also used for an ion implantation mask in place of the above photoresist film 18.

The photoresist film is limited in thickness to 1 to 2 μm to keep its inherent resolution. The conventional ion implantation technique is conducted generally by ion acceleration energy or 200 keV and maximum acceleration energy of 400 keV in double charging process. Also, a commercially available ion implantation equipment developed recently can provide a high ion acceleration energy of MeV level. Hence, the photoresist is poor in stopping power of ion having such high accelerated energy to permit implanted ion to pass through the resist. For example, when a photoresist film 18 of 1.1 μm is used as a mask for applying with a high energy of 400 keV an impurity ion under the gate oxide film 13 in the MOS transistor including the protective film 16 as shown in FIG. 5, the implanted ion passes through the photoresist film 18 and further the metal wiring 17 or stops therein to deteriorate reliability of the metal wiring 17.

In detail, when the ion uses $^{11}B^+$, it is so calculated that an average of projection range $R_p$ of B at 400 keV is 3.076 μm, a standard deviation $\Delta R_p$ 0.180 μm, $R_p$ in the metal (Al) 0.935 μm and $\Delta R_p$ therein 0.123 μm. In this case, the implanted B having 400 keV must stop in the metal wiring and distribution of the B ion therein is simulated as FIG. 3 (a). The metal wiring has problems in wiring resistance, moisture proof and reliability and is desired to be improved for the processes particularly after 0.5 to 0.3 μm ruling.

Also, to avoid interference between the implanted ion and the metal wiring, such means may be adopted that (i) a lower energy for ion implantation is used, (ii) thickness of photoresist is made larger, and (iii) any mask element of a higher ion stopping power is employed. The means (i) is not available due to the inherent process of device construction, and the means (ii) has presently a limit to 3 μm at maximum in relation to pattern shift and resolution of the resist. Also, PIQ (polyimide) used recently for photoresist has problems in an opening portion that tends to be largely tapered to thereby be substantially decreased in diameter, and also in uniformity in coating of the wafer surface portion. For the means (iii), a mask element such as a thermal oxide film, a CVD metal film or the like is not usable due to a critical heat resistance (575° C.) of metal wiring (Al) and the trouble in holing process of a formed mask element.

The present invention has been designed to overcome the above problems.

SUMMARY OF THE INVENTION

An object of the invention is to provide a preparing process for a semiconductor device through which a mask pattern can be formed on a photoresist with high resolution and without the trouble in holing process of the photoresist and pattern shift thereof, with which mask pattern an impurity ion with high energy can be applied to the photoresist from above so as to be well prevented from reaching the wiring layer which thereby exhibits high reliability, the impurity ion being implanted under a gate electrode to form a channel region in the semiconductor device.

According to the invention, it provides a process for preparing a semiconductor device, which comprises; forming on a semiconductive silicon substrate a gate oxide film and a gate electrode constituting a MOS transistor, a semiconductor element protective film on the gate electrode and a wiring layer on the protective film; forming, above the gate electrode, a first photoresist film having an opening correspondingly in position to a point that a channel region is to be provided, a silicon oxide film provided by spin-on-glass method and a second photoresist film having the same pattern as the first photoresist film in this order; etching by use of the second photoresist film as a mask to form a mask pattern which comprises three layers of the first and second photoresist films and the intervening silicon oxide film sandwiched therebetween and has an opening above the gate electrode correspondingly in position to that point for provision of the channel region; and applying an impurity ion of high energy from above and through which mask pattern to be implanted under the gate electrode to form the channel region.

According to a second invention, there is further provided a preparing process of a semiconductor device, through which process on a semiconductive silicon substrate are formed a gate oxide film and a gate electrode constituting a MOS transistor, a semiconductor element protective film on the gate electrode and a wiring layer on the protective film, on which formed in the order are a first photoresist film, a silicon oxide film provided by spin-on-glass process and a second photoresist film having an opening above the gate electrode correspondingly in position to a point that a channel region is to be provided, so that the silicon oxide film is etched by use of the second photoresist film as a mask to be holed and ashing of the second photoresist film and etching of the first photoresist film by use of the silicon oxide as a mask are conducted so as to form a mask pattern which comprises two layers of the first photoresist film and the silicon oxide film and has an opening above the gate electrode correspondingly in position to that point for provision of the channel region, from above and through which mask pattern an impurity ion of high energy is applied to be implanted under the gate electrode to form the channel region.

Further details of the present invention will be referred to hereunder according to the accompanied drawings.

BRIEF DESCRIPTION OF THE DRAWINGS

FIGS. 1 and 2 are schematic diagrams showing the steps for preparing a semiconductor device in accordance with the present invention.

FIGS. 3 (b) and (c) are graphs explaining specific relationships between density and depth of applied impurity ion with high energy implanted by use of a mask pattern in accordance with the present invention.

DETAILED DESCRIPTION OF THE PREFERRED EMBODIMENTS

Figure 3A:
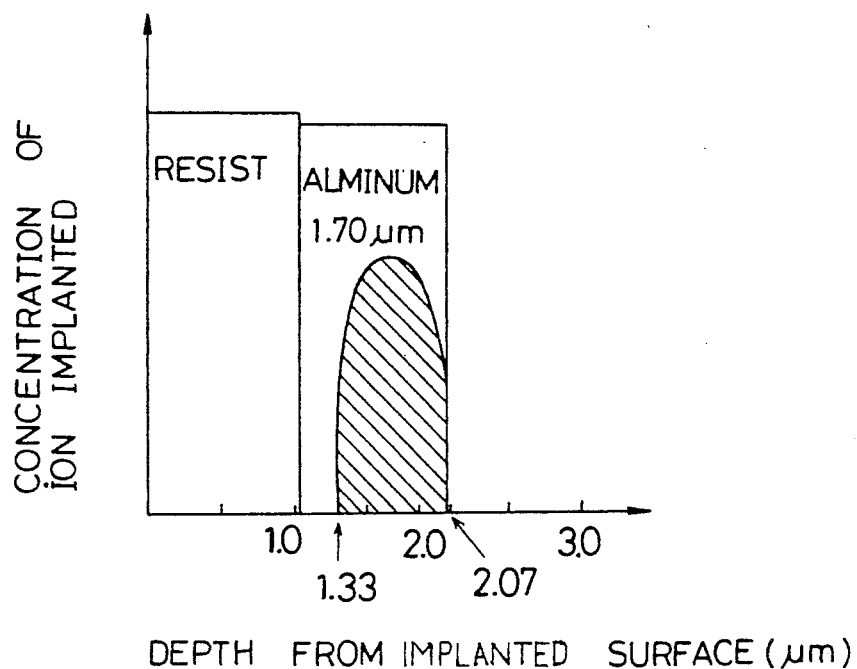
FIG. 3 (a) is a graph explaining a relationship between density and depth of applied impurity ion with high energy implanted by use of a conventional mask pattern.

In the preparing process of semiconductor devices according to the foregoing invention, on a semiconductive silicon substrate are formed a gate oxide film and a gate electrode constituting a MOS transistor, a semiconductor element protective film on the surface forming the gate electrode and a wiring layer on the protective film. These formation can be performed by the conventional methods known the art.

The semiconductor element protective film (passivation film) is provided for protecting the silicon substrate. Materials therefor are, for example, a layered member of NSG (non-doped silicate glass) and BPSG (boron phosphorus silicate glass), PSG (phosphorus silicate glass) or the like and to be layered on and above the silicon substrate including the region placed above the gate electrode. The thickness of the protective film is preferably in the range from 0.5 to 1.0 μm. The wiring layer may be a wiring pattern of aluminum or aluminum alloy in thickness of 0.5 to 1.5 μm formed by the conventional method.

Formed above the gate electrode in the order are a first photoresist film having an opening correspondingly in position to a that a channel region is to be provided, a silicon oxide film provided by spin-on-glass method and a second photoresist film having the same pattern as the first photoresist film.

The first photoresist film is provided for forming a mask to apply an impurity ion in the silicon substrate under the gate electrode. A photoresist solution used in a customary preparing process of semiconductor devices is spincoated to form a photoresist film of 1 to 2 μm in thickness. The photoresist film is applied with light by a conventional lithography at its portion above a part of the gate electrode corresponding to a point where a channel region is to be provided, and developed to be holed. Also, the silicon oxide film is provided for constituting the mask. A solution of e.g., Si(OH)₄ in an organic solvent is coated on the first photoresist film by spin-on technique followed by baking at a temperature (usually about 120° to 130° C.) that does not influence upon the first photoresist film, thereby changing the coated film to silicon oxide. The thickness of the silicon oxide film is preferably 1.0 to 2.5 μm. The silicon oxide film when of less than 0.5 μm in thickness unfavourably allows an applied high energy impurity ion (B+, P+ or the like of 400 to 1000 keV) to pass through the silicon oxide film and be implanted into the wiring layer. Further, the second photoresist film is provided for etching a portion of the silicon oxide film above the gate electrode correspondingly to that point for provision of the channel region to thereby have an opening, and also for constituting the aforesaid mask. A photoresist solution used in a customary preparing process of semiconductor devices is spincoated to form a photoresist film of 1 to 2 μm in thickness on the silicon oxide film. The photoresist film is applied with light and developed to have the same pattern as the first photoresist film.

The silicon oxide film is etched by use of the second photoresist film as a mask to form a mask pattern which comprises three layers of the first and second photoresist films and the intervening silicon oxide film sandwiched therebetween and has an opening above the gate electrode correspondingly in position to that point for provision of the channel region.

The opening is provided for implanting under the gate electrode an impurity ion having high energy and applied from above and can be holed in position above the gate electrode correspondingly to a point where the impurity ion is to be applied. When an impurity ion of high energy is applied to the mask pattern from above, the mask pattern allows the applied ion to be implanted into a predetermined position through the opening portion, preventing the ion from being implanted into the wiring layer.

In the present invention, an impurity ion with high energy is applied from above and through the mask pattern to be implanted under the gate electrode to thereby form a channel region. The impurity ion may use B+, P+, As+, Sb+ or the like applied with energy of 400 to 4000 keV.

After formation of the channel region, the mask pattern is removed followed by forming a dielectric layer on the wiring layer to complete the semiconductor device.

In the foregoing process, on the surface forming the wiring layer, a first photoresist film, a silicon oxide film provided by spin-on-glass method and a second photoresist film having an opening above the gate electrode correspondingly in position to a point that a channel region is to be provided.

The silicon oxide film formed by the spin-on-glass method and the first photoresist film are provided for constituting the mask. The first photoresist film is usually 1–2 μm thick. A solution of e.g., Si(OH)₄ in an organic solvent, is coated on the first photoresist film by spin-on technique followed by baking at a temperature (120° to 130° C.) that does not influence upon the first photoresist film, thereby changing the coated film to silicon oxide film. The thickness of the silicon oxide film is preferably 1.5 to 3.0 μm. The silicon oxide film when of less than 1.0 μm in thickness unfavourably allows an applied high energy impurity ion (B+, p+ or the like of 400 to 1000 keV) to pass through the silicon oxide and be implanted into the wiring layer.

The second photoresist film is provided for holing the first photoresist film and the silicon oxide film at their portions corresponding to that point for provision of the channel region and has an opening above the gate electrode correspondingly in position to that same point.

In this alternative process, the silicon oxide film is etched by use of the second photoresist film as a mask to be opened.

Ashing of the second photoresist film and etching of the first photoresist film by use of the silicon oxide film as a mask are conducted so as to form a mask pattern which comprises two layers of the first photoresist film and the silicon oxide film and has an opening above the gate electrode correspondingly in position to that point for provision of the channel region.

The ashing is preferably carried out by $O_2$ plasma, so that when $O_2$ plasma ashes and removes the second photoresist film, the first photoresist film can be self-aligned and opened in a predetermined pattern.

From above and through the mask pattern an impurity ion with high energy is applied to be implanted under the gate electrode to form the channel region.

After formation of the channel region, the mask pattern is removed and a dielectric layer is formed on the wiring layer to complete the semiconductor device.

The silicon oxide film formed on the first photoresist film at a low temperature in accordance with spin-on-glass method prevents an impurity ion of high energy from being implanted into the wiring layer.

EXAMPLES

Next, the invention will be illustrated by the following examples, in reference with the accompanied drawings.

EXAMPLE 1

As shown in FIG. 1(a), N+source drain 2 and gate oxide film 3 and gate electrode 4 were formed on the p-type silicon substrate 1 of (100) in plane direction in accordance with the conventional means. A passivation film 6 (NSG+BPSG film) of 7000 Å was deposited on the MOS transistor construction. Then, an aluminum wiring layer 7 of 1 $\mu$m in thickness was formed by the conventional means, and a first photoresist film 8a of 1.1 $\mu$m was spin-coated by use of a positive photoresist solution of novolac resin-0-quinone diazo compound and holed in an alignment manner.

Next, as shown in FIG. 1(b), a spin-on-glass (SOG) solution was coated and baked at 120° to 130° C. to form a silicon oxide layer 9 of 1 $\mu$m in thickness.

A second photoresist film 8b of 1.1 $\mu$m in thickness similarly with the first photoresist layer was formed and patterned by use of the same mask pattern as used for the first photoresist layer. The silicon oxide layer 9 (SOG) was dry-etched by use of the second photoresist layer as a mask.

Figure 3B:
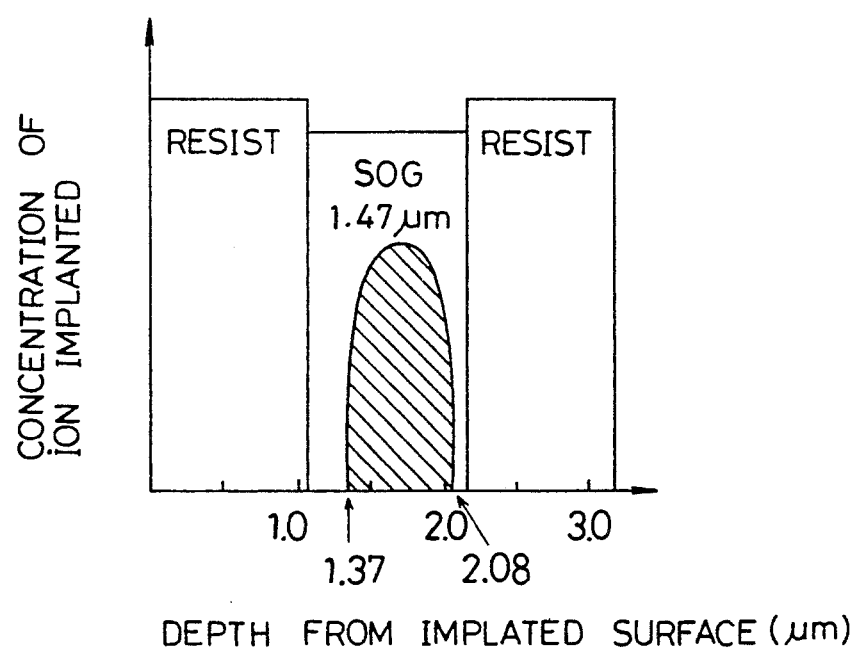

The opening portion of the mask serves to pattern for the ion implantation region and may be used as a three-layered mask comprising resist, SOG and resist. The three-layered mask hitherto had a problem of deterioration of reliability of the metal wiring layer due to interference between the metal wiring layer and the applied ion as shown in FIG. 3(a) when $^{11}B^+$ is implanted at 400 keV under the gate electrode to vary threshold value of the transistor. In this example of the present invention, the interference between the metal wiring and the applied ion can be restrained to improve reliability of the semiconductor device as shown in FIG. 3(b) (showing the simulation).

EXAMPLE 2

Figure 3C:
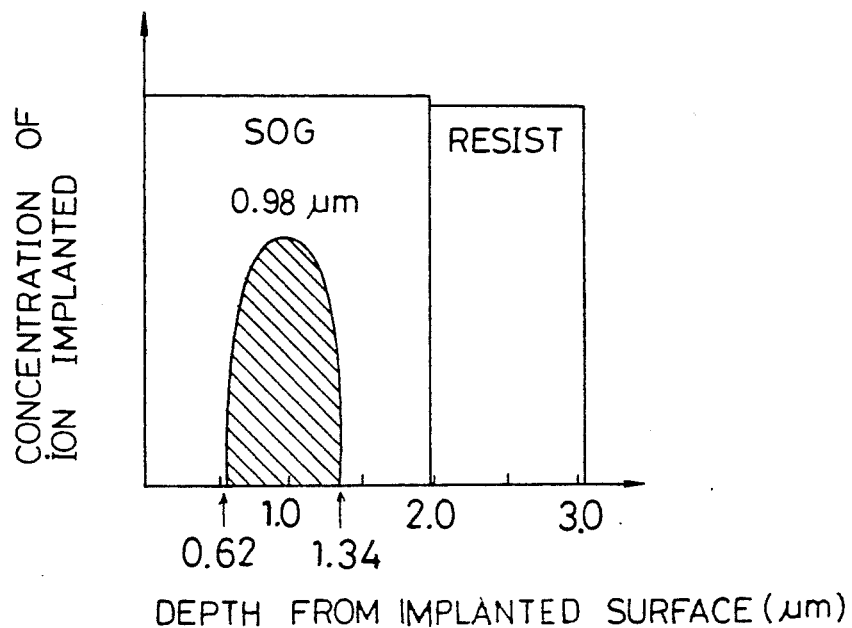

As shown in FIG. 2(a), a silicon oxide film (SOG) is spin-coated 2 $\mu$m in thickness on the first photoresist film 8a in accordance with spin-on-glass method, in place of the alignment holing of the first photoresist film 8a as in the examples, and baked to form a SOG layer 9. Then, as shown in FIG. 2(b), a second photoresist film 8b of 1.1 $\mu$m in thickness, the third layer, was formed and patterned, and the SOG layer 9 was etched by use of the pattern. Next, as shown in FIG. 2(c), the second photoresist film 8b, the third layer was ashed by $O_2$ plasma to hole the photoresist film at the first layer. Other processes were the same as those in the first example to complete a semiconductor device. The photoresist at the first layer is self-aligned with the pattern of the photoresist at the third layer and may be usable for an ion implantation mask. Also, the problem of interference between the metal wiring and the applied ion when $^{11}B^+$ is implanted at 400 keV was avoided as shown in FIG. 3(c).

Figure 4:
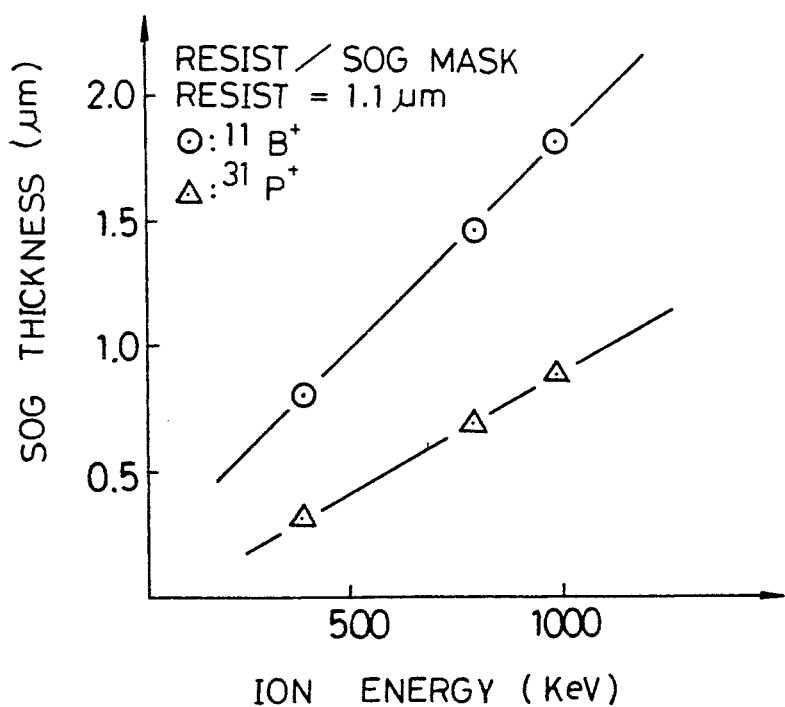
FIG. 4 is a graph explaining thickness of silicon oxide film provided by the spin-on-glass method and available energy with impurity ion to be applied.
Figure 5:
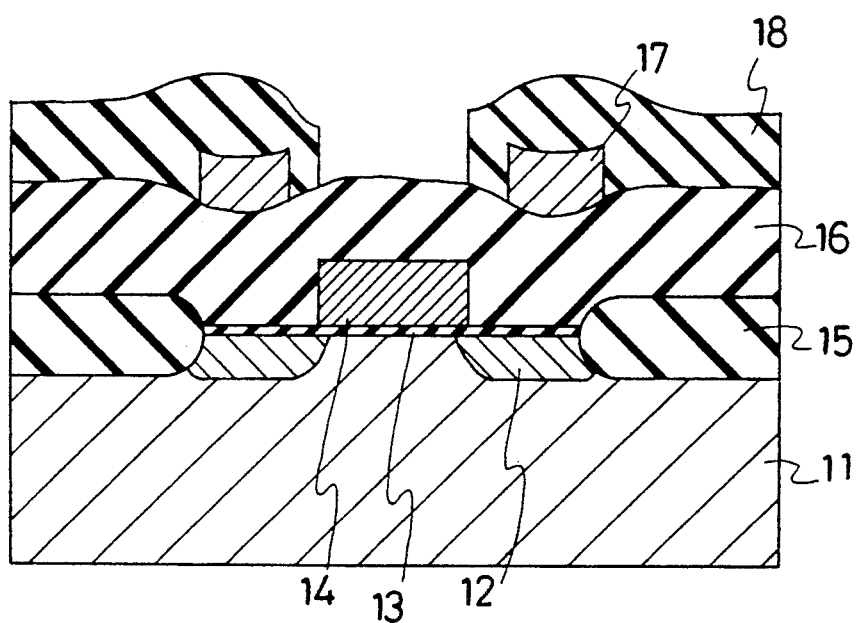
FIG. 5 is a schematic diagram showing a conventional semiconductor device.

Relationship between applied ion energy and thickness of SOG (silicon oxide) for stopping of applied high energy impurity ion in the photoresist at the second layer is calculated as shown in FIG. 4. When $^{11}B^+$ is applied at 1 MeV, the ion can be prevented from passing through the underlying wiring layer with SOG being 1.8 $\mu$m in thickness. When $^{31}P^+$ is employed, SOG is enough to be 0.9 $\mu$m in thickness for the purpose.

According to the process for preparing semiconductor devices of the present invention, a mask pattern can be formed with high resolution without the trouble and the pattern shift in the holing step, so that an impurity ion of high energy when applied is sufficiently prevented from reaching the aluminum wiring layer but is implanted under the gate electrode to form a channel region.

What we claimed is:

1. A process for preparing a semiconductor device, which comprises: forming on a semiconductive silicon substrate a semiconductor element, a semiconductor element protective film on the semiconductor element and a wiring layer on the protective film; forming sequentially a first photoresist film having an opening corresponding in position to a point where an active region is to be provided, a silicon oxide film provided by a spin-on-glass method and a second photoresist film having the same pattern as the first photoresist film; etching by use of the second photoresist film as a mask to form a mask pattern which comprises three layers of the first and second photoresist films and the intervening silicon oxide film sandwiched therebetween and having an opening corresponding in position to said point for provision of the active region; and implanting an impurity ion with high energy into the semiconductive substrate from above the mask pattern and through the semiconductor element to form the active region under the semiconductor element.

2. A process as set forth in claim 1, wherein the first photoresist film has a thickness of 1-2 $\mu$m.

3. A process as set forth in claim 1, wherein the silicon oxide film has a thickness of 1.0-2.5 $\mu$m.

4. A process as set forth in claim 1, wherein the second photoresist film has a thickness of 1-2 $\mu$m.

5. A process for preparing a semiconductor device, which comprises: forming on a semiconductive silicon substrate a semiconductor element, a semiconductor element protective film on the semiconductor element and a wiring layer on the protective film; forming sequentially a first photoresist film, a silicon oxide film provided by a spin-on-glass method and a second photoresist film having an opening corresponding in position to a point where an active region is to be provided; etching the silicon oxide film by use of the second photoresist film as a mask to form an opening; ashing the second photoresist film by use of the silicon oxide as a mask to form a mask pattern for protecting the wiring layer from being implanted with an impurity ion during a succeeding ion implantation process, which mask pattern comprises two layers of the first photoresist film and the silicon oxide film and having an opening corresponding in position to said point for provision of the active region; and implanting an impurity ion with high energy into the semiconductive substrate from above the mask pattern and through the semiconductor element to form the active region under the semiconductor element and wherein said mask pattern prevents penetration into said wiring layer by said impurity ion.

6. A process as set forth in claim 5, wherein the first photoresist film has a thickness of 1-2 μm.

7. A process as set forth in claim 5, wherein the silicon oxide film has a thickness of 1.5-3.0 μm.

8. A process as set forth in claims 1 or 5, wherein the impurity ion applied has an energy of 400-4000 keV.

9. A process as set forth in claims 1 or 5 wherein said semiconductor element comprises a gate electrode of a MOS transistor.

* * * * *